United States Patent [19]

Sato

[11] Patent Number: 4,864,227
[45] Date of Patent: Sep. 5, 1989

[54] WAFER PROBER

[75] Inventor: Mitsuya Sato, Yokohama, Japan

[73] Assignee: Canon Kabushiki Kaisha, Tokyo, Japan

[21] Appl. No.: 158,736

[22] Filed: Feb. 23, 1988

[30] Foreign Application Priority Data

| Feb. 27, 1987 | [JP] | Japan | 62-43192 |
| Feb. 27, 1987 | [JP] | Japan | 62-43193 |
| Feb. 27, 1987 | [JP] | Japan | 62-43194 |
| Feb. 27, 1987 | [JP] | Japan | 62-43195 |

[51] Int. Cl.$^4$ .................. G01R 31/02; G01R 1/06
[52] U.S. Cl. ................. 324/158 F; 324/73 PC; 324/158 P; 324/158 R; 364/559
[58] Field of Search .......... 324/158 F, 158 P, 73 PC, 324/73 AT; 364/559, 552; 356/400, 222; 33/533, 557

[56] References Cited

U.S. PATENT DOCUMENTS

| 3,930,809 | 1/1976 | Evans | 324/158 F X |
| 3,996,517 | 12/1976 | Fergason et al. | 324/158 F X |
| 4,201,939 | 5/1980 | Lee et al. | 324/158 F X |
| 4,266,191 | 5/1981 | Spano et al. | 324/158 F X |
| 4,328,553 | 5/1982 | Fedriksen et al. | 364/559 X |
| 4,615,621 | 10/1986 | Allen et al. | 356/400 X |
| 4,627,010 | 12/1986 | Kosugi | 356/400 X |
| 4,669,884 | 6/1987 | Bigelow et al. | 356/400 X |
| 4,677,474 | 6/1987 | Sato | 324/158 P |
| 4,758,785 | 7/1988 | Rath | 324/73 PC X |

*Primary Examiner*—Reinhard J. Eisenzopf
*Assistant Examiner*—Vinh P. Nguyen
*Attorney, Agent, or Firm*—Morgan & Finnegan

[57] ABSTRACT

Wafer prober usable for examining, in a predetermined sequence, integrated microcircuits formed on a semiconductor wafer, is disclosed. The prober includes a contact plate which is movable in a Z-axis direction (the direction of height). The contact of the contact plate to a probe needle group is detected by detecting deformation of the contact plate. From the position of the contact plate at the time of deformation, the position of the needle tips of the probe needle group in the Z-axis direction is detected automatically. In another aspect, a laser beam source and a photosensor are provided as a unit with a wafer stage which is movable in each of an X-axis direction, a Y-axis direction and a $\theta$ (rotational) direction while carrying thereon a semiconductor wafer. With the aid of the movement of the wafer stage, the laser beam emitted from the laser beam source toward the photosensor is crossed by the probe needle group. On the basis of an output of the photosensor and the position of the wafer stage, at the time of the crossing, the position of the probe needle group with respect to each of the X-axis direction, the Y-axis direction and the $\theta$ direction is detected automatically. In a further aspect, automatization of the positioning of a probe card occurs when it is introduced into a wafer prober.

15 Claims, 6 Drawing Sheets

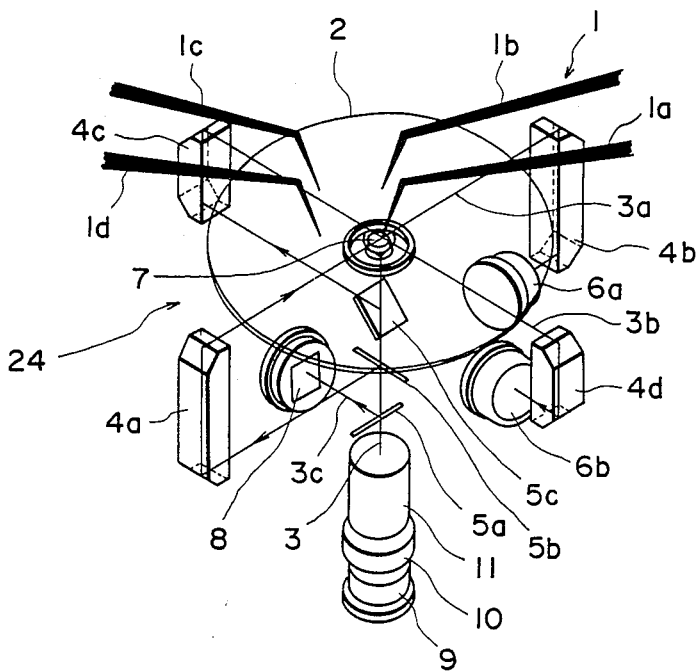
F I G. 1

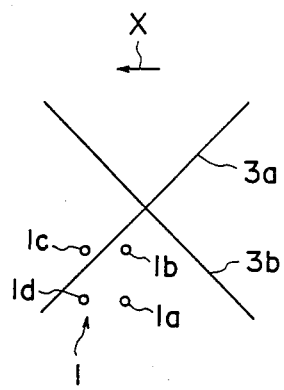
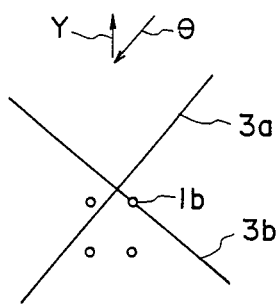
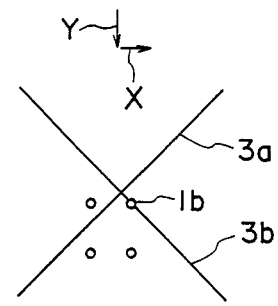
FIG. 4A  FIG. 4B  FIG. 4C
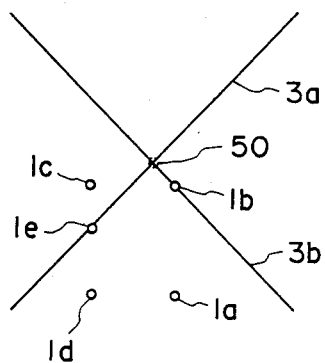
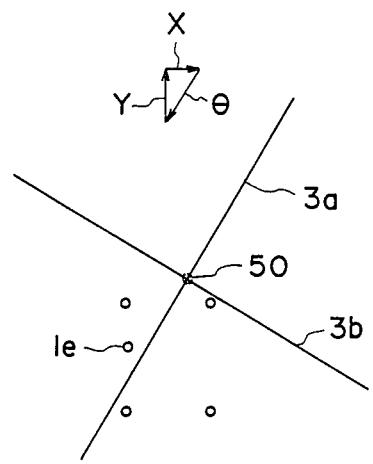
FIG. 4D  FIG. 4E

WAFER PROBER

FIELD OF THE INVENTION AND RELATED ART

This invention relates to a wafer prober usable for the probing examination of semiconductor chips and, more particularly, to a wafer prober having an automatic aligning function for automatically aligning a probe card set in the prober to establish electric contact between the probe card and bonding pads of semiconductor chips.

A wafer prober is an apparatus which is used at the time of measurement of characteristics of each of a number of IC chips formed on a semiconductor wafer.

For the measurement, the examination itself is carried out by a tester called "IC tester". The wafer prober is used to provide correct electric contact between the IC tester and each of the IC chips on a wafer. Such electric contact is accomplished by use of a printed board which is called "probe card" and which is provided with contact needles (probe needles) having tips corresponding to the positions of bonding pads of each IC chip.

Upon examination, such a probe card is set in a wafer prober and a wafer, which is the subject of measurement, is placed below the probe card. At this time, it is necessary to align the tips of probe needles of the probe card with the bonding pads of a semiconductor IC chip, disposed thereunder, with respect to four directions, i.e. an X-axis direction, a Y-axis direction, a Z-axis direction and a $\theta$ (rotational) direction (see FIG. 2).

Conventionally, such an aligning operation is accomplished manually by an operator on the basis of observation of tips of probe needles by using a manual alignment scope or a microscope. More specifically, in respect to the $\theta$ direction, the operator rotates the probe card to adjust the position thereof in the $\theta$ direction. In regard to the X and Y directions, the adjustment is made after completion of the position adjustment with respect to the $\theta$ direction and, for this purpose, the operator displaces the wafer in the X and Y directions so that the bonding pads of a particular IC chip are placed just underneath the probe needles (needle tips), respectively. With regard to the Z direction (height), the adjustment is made after completion of the position adjustment with respect to the X, Y and $\theta$ directions, by moving the wafer upwardly so that it actually contacts the probe needles (needle tips). By this, the card-to-wafer alignment, called "probe card alignment", is accomplished.

SUMMARY OF THE INVENTION

The card-to-wafer alignment operation requires, as described, very complicated and time-consuming workings. Further, the precision of probe card setting with respect to a wafer is determined by the skill of the operator. This is one of the factors which make the accuracy of IC chip examination unstable.

In order to automatize such probe card alignment, there may be many conditions or limitations to be satisfied or considered. That is:

(1) The position of the needle tips can be detected accurately, with the probe needles being deformed by the press-contacting, to a wafer, at a very light stylus pressure of an order of 10 g, for example.

(2) The needle tips should not be contaminated (3) The probe needles should not be electrically short-circuited.

(4) The position of the needle tips can be detected without applying any electric signal to the probe needles, in consideration of that the probe needles are electrically connected to an IC tester.

(5) The position of the needle tips can be detected stably and with certainty, regardless of the shape or configuration of the needle tips.

(6) There should not be a necessity of consumables.

(7) The position of the needle tips can be detected quickly.

(8) The position detecting system should be compact and light in weight.

(9) The position detecting system can be manufactured at a low cost.

It is accordingly an object of the present invention to provide a wafer prober by which the probe card alignment with respect to at least one of the X, Y, $\theta$ and Z directions can be attained automatically while satisfying the conditions (1)–(9) set forth hereinbefore.

Briefly, in accordance with one aspect of the present invention, to achieve the above object, there is provided a wafer prober wherein a plate-like member is press-contacted to a probe needle group by use of press-contacting means and wherein the deformation of the plate-like member caused by the press-contact is detected.

Once the deformation is detected, it is possible to determine the coincidence of the position of the needle tips of the probe needle group with the position of the plate-like member. Therefore, by monitoring the position of the plate-like member, the position of the probe needle group with respect to the Z direction (the direction of height) can be detected automatically.

The deformation of the plate-like member can be detected in a suitable manner. For example, one of the opposite surfaces of the plate-like member, not contacting the probe needle group, may be provided by an electrically conductive thin film which is contactable to a base member at the time of the press-contact of the plate-like member to the probe needle group. The base member may be made of an electrically conductive material Thus, by electrically detecting the contact between the thin film and the base member, any deformation of the plate-like member can be detected.

The central portion of plate-like member may be divided into plural segments, for lightening in weight. The division of the plate-like member is effective to increase the mechanical resonance frequency of the plate-like member and, therefore, is effective to prevent accidental contact of the plate-like member with the base member, placed thereunder, due to external vibration. Further, plate-like member may have a controllable spring constant. For example, a gaseous fluid such as an air may be flown under the plate-like member with a controlled fluid pressure, thus controlling the spring constant of the plate-like member.

In accordance with another aspect of the present invention, there is provided a wafer prober wherein one or more laser beams are projected generally horizontally toward a probe needle group of a probe card. Once such a laser beam is intercepted by a tip portion of a probe needle, the interception is detected. Then, on the basis of the detection, the position of the needle tip with respect to the X and Y directions as well as the position of the probe needle group with respect to the $\theta$ direction may be determined by calculation.

At the time when a laser beam is intercepted, a tip portion of a probe needle is being located on that laser beam. Thus, when two orthogonally advancing laser beams are used, for example, it is possible to determine the coincidence of the position of the needle tip of a probe needle with the position of the intersection (with respect to a co-ordinate system) of the two laser beams. In this manner, the position of the needle tip of a probe needle can be detected automatically.

As one way for such an automatic measurement, only one laser beam may be used. Namely, after the laser beam is intercepted by a tip portion of a probe needle, the laser beam is rotationally shifted about a predetermined point contained in a plane in which the laser beam is included. Additionally, the laser beam is translationally shifted simultaneously, within the aforesaid plane, so that the laser beam is continuously intercepted by the tip portion of the probe needle. From the angle of rotation and the amount of translation, the position of the probe needle, blocking the laser beam, can be determined by calculation.

Further, a single laser beam or two laser beams may be projected so that the single laser beam impinges upon the detected tip portion of the probe needle or the two laser beams intersect at the position of the detected tip portion of the probe needle. By rotating the laser beam or beams, any error in the detection of the needle tip position can be discriminated.

In accordance with a further aspect of the present invention, there is provided a wafer prober wherein a spring-supported minute flat plate is press-contacted to the tip of a probe needle of a probe card by use of a press-contacting means. Any inclination of the minute flat plate resulting from the press-contacting is detected and, on the basis of the detection, the position of the tip of the probe needle, with respect to the X and Y directions upon the minute flat plate, can be determined.

The minute flat plate may be over driven in the press-contacting direction to the tip of the probe needle. By detecting any inclination of the thus over driven minute flat plate, the position of the probe needle tip can be determined by calculation, very precisely.

The inclination can be detected in a suitable manner. For example, a laser beam may be projected upon the back of the minute flat plate and the light reflected therefrom may be detected by use of a position sensor, an image sensor comprising a charge-coupled device (CCD), or otherwise.

At the time of the press-contact of the minute flat plate to the probe needle tip, the probe needle may be deformed as a result. Therefore, the minute flat plate may not incline in proportion to the amount of overdrive. Accordingly, it may be necessary to predetect the ratio of the spring constant of a spring means supporting the minute flat plate to the spring constant of the probe needle and, thus, to take into account the predetected ratio at the time of calculation of the position of the probe needle tip. In this connection, according to one preferred form of the present invention, the probe needle tip is press-contacted in sequence to plural points or locations upon the surface of the minute flat plate. According to another preferred form of the present invention, the minute flat plate is repeatedly press-contacted to the probe needle tip with different amounts of overdrive. In any case, the ratio of the spring constant of the spring means supporting the minute flat plate to the spring constant of the probe needle can be calculated on the basis of the values concerning the inclination of the minute flat plate, detected with respect to the plural locations on the minute flat plate or different amounts of overdrive.

Further, from the calculated ratio of the spring constants, the optimum amount of overdrive that provides a stylus force load best suited to the probing may be determined by calculation. By using, upon the probing operation, the data obtained by the calculation, the optimum stylus force load can be automatically set. Such an automatic stylus force setting is one of the function which are not attainable with conventional type wafer probers.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view of a needle sensing unit of a wafer prober according to one embodiment of the present invention.

FIGS. 4A–4E are illustrations for explicating the manner of detecting the position of a probe needle by use of crossed laser beams.

DESCRIPTION OF THE PREFERRED EMBODIMENTS

Figure 2:
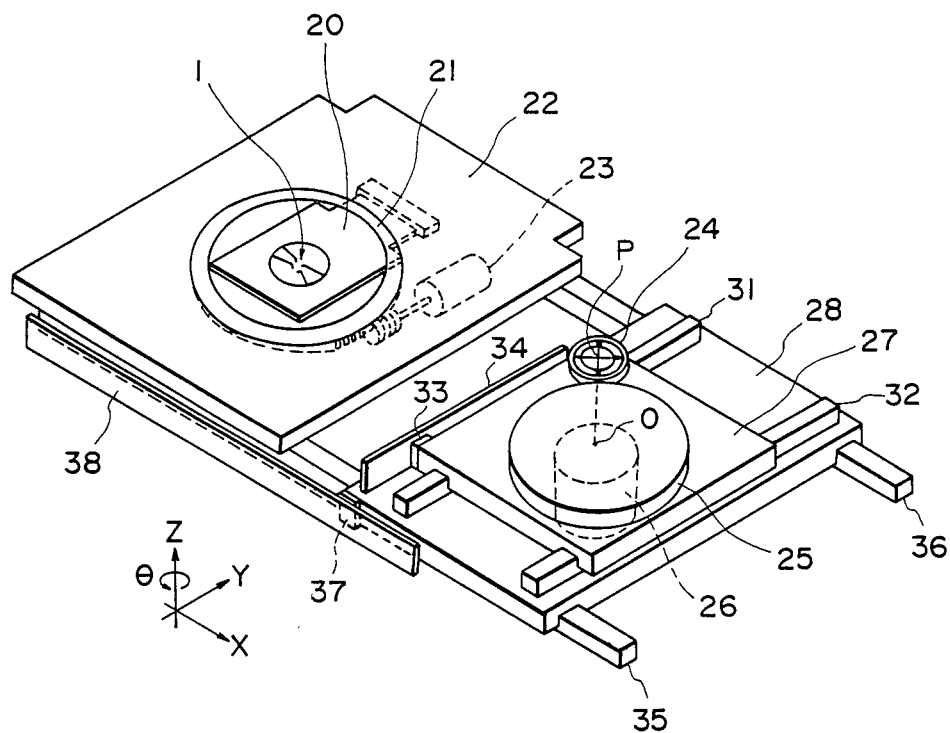
FIG. 2 is a perspective view showing elements disposed close to the needle sensing unit of the wafer prober according to the FIG. 1 embodiment.

Referring first to FIG. 1, there is shown a needle sensing unit, denoted generally at 24, of a wafer prober according to one embodiment of the present invention.

Denoted at 1 in FIG. 1 is a probe needle group which is the subject of detection. In FIG. 1, only four probe needles 1a–1d are illustrated. The probe needles 1a–1d are located at the "four corners" of the probe needle group 1. Contact plate 2 is movable along a Z axis (FIG. 2) so as to be press-contacted to the probe needle group 1, for the detection of the position of the needle tips of the probe needle group 1 with respect to the Z direction (the direction of height). Laser beam 3 is projected and used to detect the position of a needle tip of the probe needle group 1 in an X-Y plane (a plane containing X and Y axes). The laser beam 3 passes through half mirrors 5a, 5b and 5c in this order and, thereafter, is reflected by the back of a needle sensing plate 7 (see FIG. 6). The laser beam reflected by the back of the needle sensing plate 7 is reflected again by the half mirror 5a, as denoted at 3c in FIG. 1, and is incident upon a position sensor 8 which may be a CCD image sensor as an alternative.

On the other hand, the laser beam reflected by the half mirror 5b enters into a prism 4a and, after passing therethrough, it advances as denoted at 3a toward another prism 4b, while travelling above the contact plate 2 surface and substantially in parallel to the X-Y plane. After passed through the prism 4b, the laser beam 3a is incident upon a photodetector 6a. As compared therewith, the laser beam reflected by the half mirror 5c passes through a prism 4c and, thereafter, advances as denoted at 3b toward another prism 4d, while travelling above the contact plate 2 surface and substantially in parallel to the X-Y plane. After passing the prism 4d, the laser beam 3b is incident upon a photodetector 6b.

It should be noted that, in the present embodiment, the laser beams 3b and 3c advance so that they intersect, substantially at a right angle, at a point P (FIG. 2) which is above, approximately, the center of the contact plate 2, i.e. which is above the needle sensing plate 7. The contact plate 2 is disposed so that its surface is substantially parallel to the X-Y plane.

The needle sensing plate 7 is provided to measure or detect, precisely, the position of the tip of a needle of the probe needle group 1 with respect to the X-Y plane. As will be described later in detail in conjunction with FIG. 6, the needle sensing plate 7 is effective to change the direction of advancement of the laser beam, to be reflected by the back surface thereof, in accordance with the inclination thereof caused when it is press-contacted to the tip of a probe needle. The position sensor 8 is provided to detect the inclination of the needle sensing plate 7 and produces an electric signal corresponding to the position, upon the light-receiving surface thereof, of the laser beam 3c having been reflected by the back surface of the needle sensing plate 7.

Semiconductor laser 9 is used in the present embodiment. The laser beam outputted from the laser 9 is collimated by a collimator 10. The collimated laser beam enters into a beam shrinker 11, whereby the diameter of the laser beam is reduced as desired such that the laser beam 3 is provided. The needle sensing unit 24 comprises the above-described elements denoted at reference numerals 2–11, and is formed as a unit with a wafer chuck 2 as will be described later.

FIG. 2 is a perspective view showing elements disposed in the neighborhood of the needle sensing unit 24 of the structure shown in FIG. 1.

In FIG. 2, probe card 20 is provided with a probe needle group 1, comprising a number of probe needles (only four of which are illustrated), mounted to the lower surface of the probe card 20. The probe card 20 is detachably mounted to a head plate 22 by means of a card holder 21. The card holder 21 is rotatably held by the head plate 22. Pulse motor 23 is provided to rotationally drive the card holder 21 in the $\theta$ direction relatively to the head plate 22. The needle sensing unit of the structure shown in FIG. 1 is denoted at 24.

Movable wafer chuck 25 is arranged to detachably hold, by vacuum suction or otherwise, a wafer (not shown) placed thereon. $\theta$-Z unit 26 supports the wafer chuck 25 for rotational movement in the $\theta$ direction about the center thereof with the aid of a pulse motor (not shown) and also for vertical movement (upwardly and downwardly) along the Z axis. The $\theta$-Z unit 26 is placed on a Y stage 27 which is movable in the Y-axis direction. The Y stage 27 is placed on an X stage 28 which is movable in the X-axis direction. The needle sensing unit 24 is fixed to the peripheral portion of the wafer chuck 25 and is arranged to be moved as a unit with the chuck 25 in each of the X, Y, $\theta$ and Z directions under the influence of the $\theta$-Z stage 26, the Y stage 27 and the X stage 28.

The Y stage 27 is driven by a servo motor (not shown) so that it is moved in the Y direction along two guide rails 31 and 32 fixed to the X stage 28. Fixedly provided on the Y stage 27 is a position detector 33 which is adapted to optically read the graduations of a scale 34 fixed to the X stage 28. Thus, for example, the position detector 33 is operable to detect the position of the center O of the wafer chuck 25 with respect to the Y direction. On the other hand, the X stage 28 is driven by another servo motor (not shown) so as to be moved in the X direction along two guide rails 35 and 36 which are fixed to a base member, not shown. Fixedly provided on the X stage 28 is a position detector 37 which is adapted to optically read the graduations of a scale 38 fixed to the unshown base member. Thus, the position detector 37 is operable to detect the position of the center O of the wafer chuck 25 with respect to the X direction. It should be noted that the position of the wafer chuck 25 and the position of the needle sensing unit 24, both with respect to the Z direction, may be detected on the basis of the number of pulses applied to the unshown pulse motor of the $\theta$-Z stage 26.

The origins concerning the position with respect to the X, Y and Z directions may be set as desired. For example, in regard to the X and Y directions, the position of the wafer chuck 25 in the X and Y directions at a time when a prealigned wafer is placed on the wafer chuck 25 may be used as the origins in the X and Y directions. With regard to the Z direction, on the other hand, the position which is spaced downwardly by a predetermined distance from the needle tips of a probe needle group, assuming that an ideal probe card is set in the wafer prober, may be used as an origin.

Figure 3:
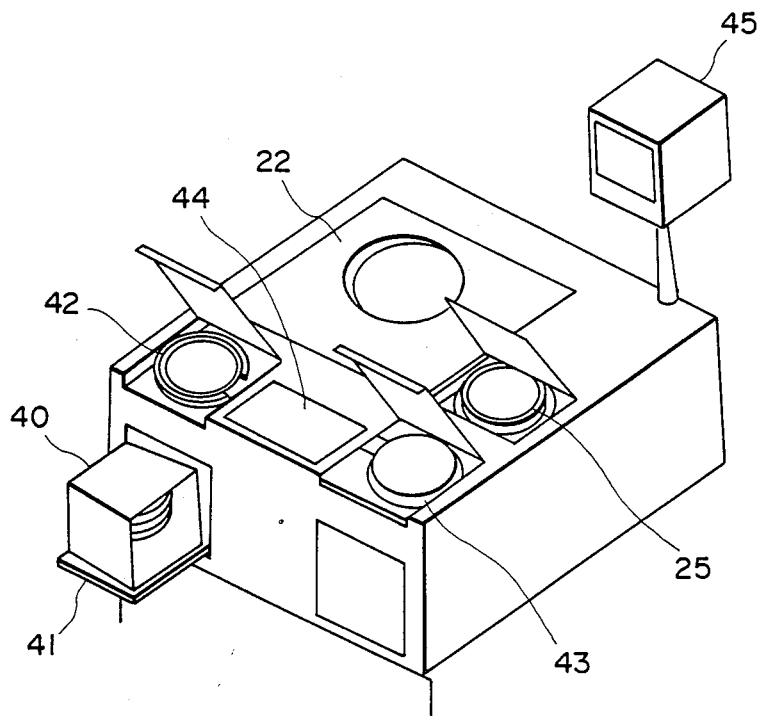
FIG. 3 is a perspective view schematically showing the appearance of the wafer prober of the FIG. 1 embodiment.

FIG. 3 is a schematic illustration of the appearance of a wafer prober into which a needle sensing unit of the structure described hereinbefore is incorporated. In FIG. 3, denoted at 40 is a wafer carrier in which a plurality of wafers are placed; at 41, a carrier table upon which the wafer carrier 40 is placed; at 42, an unloaded wafer observing station which is a station for inspecting, by the naked-eye observation, a wafer after it is examined by the wafer prober and before it is put back to the carrier 40; at 43, a prealignment station at which a wafer to be examined is prealigned (roughly aligned) before it is placed on a wafer chunk 25; at 44, an operation panel; and at 45, a TV monitor.

FIGS. 4A–4E are schematic illustrations for explicating the manner of "needle searching" for detecting the position of a probe needle by use of laser beams 3a and 3b described with reference to FIG. 1.

Figure 5:
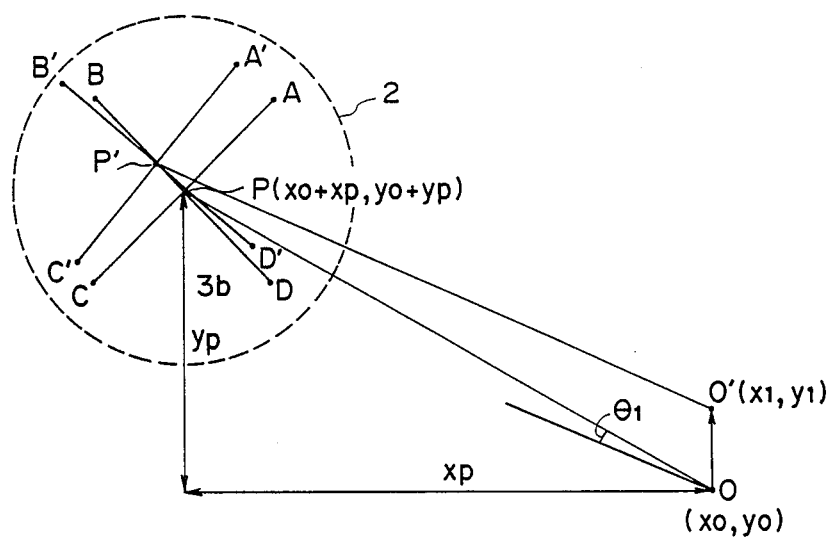
FIG. 5 is a principle view for explicating a coordinate system usable for the calculation related to the searching operation.

FIG. 5 is a representation showing a coordinate system used in the calculations to be made in the needle searching operation. In FIG. 5, reference character O having a position ($x_0$, $y_0$) corresponds the center of rotation of the wafer chuck 25 (FIG. 2) and reference character P having a position ($x_0+x_p$, $y_0+y_p$) corresponds to the point of intersection of the laser beams 3a and 3b.

Figure 6:
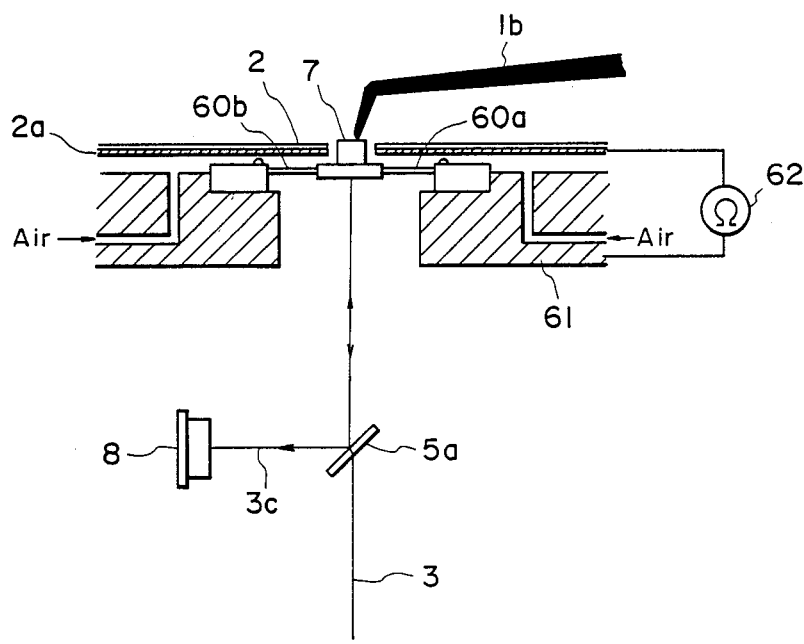
FIG. 6 is a vertical section of a load point detecting system of the wafer prober according to the FIG. 1 embodiment.

FIG. 6 is a schematic section of a load point detecting system provided around the needle sensing plate 7 and usable for detecting the exact position of a needle tip of the probe needle group 1. In FIG. 6, only one needle 1b is illustrated.

In FIG. 6, denoted at 2 is a contact plate; at 2a is a metal thin film which is formed on the lower surface of the contact plate 2; at 7, a needle sensing plate which is pressed against the probe needle 1b during the position detecting operation; at 60a and 60b, spring members for supporting the needle sensing plate 7 with respect to a base member 61 which is provided as a support for various elements of the detecting system; and at 62, a resistance meter provided to detect electrical communication between the base member 61 and the metal thin film 2a of the contact plate 2. As described with reference to FIG. 1, a laser beam 3 is projected upon the bottom surface of the needle sensing plate 7. The laser beam reflected from the needle sensing plate 7 is reflected again by a half mirror 5a so that it is incident upon a position sensor 8, as denoted at 3c in FIG. 6.

Figure 7:
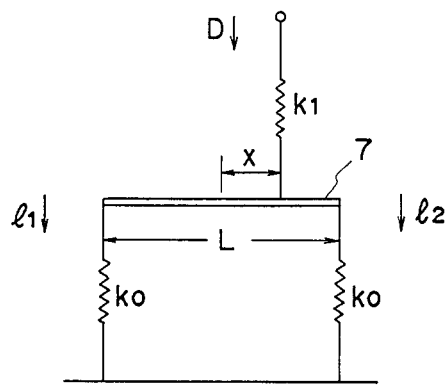
FIG. 7 is a representation showing an equivalent of the load point detecting system shown in FIG. 6.

FIG. 7 shows a one-dimensional equivalent of the load point detecting system of the structure shown in FIG. 6.

Referring now to FIGS. 1–7, description will be made of details of the alignment operation made in the wafer prober of the present embodiment.

First, description will be made to the measurement or detection of the position of the probe needle group 1 with respect to the Z direction (height).

In FIG. 2, a probe card 20 is introduced into the wafer prober and placed on the card holder 21. Then, the needle sensing unit 24 of the structure shown in FIG. 1 is moved by the cooperation of the $\theta$-Z stage 26, the Y stage 27 and the X stage 28 so that it is placed underneath a probe needle group 1 of the probe card 20. The positional relation between the needle sensing unit 24 and the probe needle group 1, as assumed at this time, is schematically illustrated in FIG. 1.

Subsequently, the needle sensing unit 24 is moved upwardly by the Z-axis drive of the $\theta$-Z stage 26. In the process of such upward movement of the needle sensing unit 24, the probe needle group 1 contacts the upper surface of the contact plate 2 and, thus, presses and deforms the plate 2 downwardly. This can be detected by monitoring, by use of the resistance meter 62, the contact between the contact plate 2 and the base member 61. Therefore, from the number of pulses having been applied to the pulse motor of the $\theta$-Z stage 26 until the contact plate 2 contacts the base member 61, the position of the needle tips of the probe needle group 1 with respect to the Z direction (height) can be determined.

It is to be noted that in the present embodiment the contact plate 2 is formed by a sufficiently thin glass plate so that it can be deformed downwardly with a sufficiently small force. Additionally, on the bottom surface of the contact plate 2, a metal thin film pattern 2a is formed in order to assure electric communication between it and the base member 61, as has been described with reference to FIG. 6.

Once the height of the probe needle group 1 is detected, the needle searching operation is initiated subsequently. Details of such a needle searching operation will now be described.

The needle searching operation is carried out by use of two laser beams 3a and 3b, in the present embodiment. The manner of such a searching operation is schematically illustrated in FIGS. 4A–4E and FIG. 5. It is to be noted here that, at the time of the searching operation, the probe needle group 1 and the contact plate 2 do not contact with each other but they are spaced from each other. Further, the subject to be searched is usually one probe needle which is preselected. Any one of the probe needles of the probe card 20 may be selected as desired. However, for convenience, description will now be made of a case where the probe needle 1b which is at a right up corner of the probe needle group (see FIG. 4A, for example) is selected as the subject of the search.

First, the X stage 28 is moved to shift the laser beam 3b in an X direction (FIG. 4A) so that the laser beam 3b is intercepted by the tip portion of the probe needle 1b. The interception of the laser beam 3b is detectable by use of the photodetector 6b (FIG. 1). In the case of FIG. 4A, the laser beam 3b is shifted leftwardly. Next, as illustrated in FIG. 4B, the $\theta$-Z stage 26 is rotationally driven in the $\theta$ direction about the center O of the wafer chuck 25 (FIG. 2) so as to rotationally shift the laser beam 3b. If, at this time, the needle sensing unit 24 being made integral with the wafer chuck 25 is simply rotated about the center O by the rotation of the $\theta$-Z stage 26, the laser beam 3b having been intercepted by the probe needle 1b will become non-intercepted.

In consideration of this, one of the X stage 28 and the Y stage 27 is moved simultaneously with the rotational movement of the $\theta$-Z stage 26 so that the laser beam 3b can be maintained intercepted. In this embodiment, the Y stage 27 is moved in a Y direction as illustrated and such Y-axis movement of the stage 27 is effected while checking the interception of the laser beam by the needle 1b by use of the photodetector 6b. The rotation of the $\theta$-Z stage 26 and the movement of the Y stage 27 are continued until the laser beam 3b is rotationally shifted by a desired angle ($\theta_1$ in FIG. 5 as will be described later) which angle is predetermined. The amount of the rotational shift of the laser beam can be detected on the basis of the number of pulses applied to the pulse motor of the $\theta$-Z stage 26.

By the above-described operation, it becomes possible to determine the position of the probe needle 1b on the laser beam 3b (or on the path thereof).

Subsequently, as illustrated in FIG. 4C, the X stage 28 and the Y stage 27 are moved in the X and Y directions, respectively, so as to translationally shift the other laser beam 3a toward the detected position of the probe needle 1b. Finally, the laser beam 3a as well as the laser beam 3b are intercepted by the needle 1b. The interception of the laser beam 3a is detectable by use of the photodetector 6a.

At this time, it is now possible to determine the position of the probe needle 1b with respect to each of the X and Y directions, on the basis of reading the scales 34 and 38.

However, consideration should be made of a possibility that, during the shifting of the laser beam 3a, the laser beam 3 is intercepted by any other probe needle such as shown at 1e in FIG. 4D. If this occurs, the detection of the interception of the laser beam 3a by the photodetector 6a may lead to an error in the detection of the probe needle 1b.

In order to prevent this, as illustrated in FIG. 4E, the laser beams 3a and 3b may be rotationally shifted about the "predicted position" of the probe needle 1b (namely, the intersection 50 of the laser beams 3 and 3b in FIG. 4D). As in the case of the FIG. 4B example, such rotational shift of the laser beams 3a and 3b is made by the cooperation of the $\theta$-Z stage 26 with the X stage 28 and/or the Y stage 27. If the "predicted position" is such as shown at 50 in FIG. 4D which does not corresponds to the needle 1b position, the above-described rotational shift of the laser beams 3a and 3b necessarily results in failure of interception of one of or both of the laser beams 3a and 3b (see FIG. 4E). Thus, it is possible to discriminate the correctness of the "predicted position" of the probe needle 1b.

By the process described in the foregoing, the position of a particular probe needle (such as the needle 1b) which may be preselected can be detected correctly.

Thereafter, the load point detecting system shown in FIG. 6 is used to detect the needle position more precisely on the basis of the detection of the loading point.

Next, while making a reference to the schematic illustration of the load point detecting system shown in FIG. 6, description will be made to the position measurement on the basis of detection of the load point.

First, in accordance with the measurements having been made in the steps described hereinbefore, the needle sensing plate 7 is displaced so that it is positioned underneath the tip of the probe needle 1b. Thereafter, the needle sensing plate 7 is moved upwardly so that the probe needle 1b is pressed against the needle sensing plate 7. More specifically, the θ-Z stage 26 is moved upwardly by the Z-axis driving pulse motor therefor (not shown) so that the needle sensing plate 7 is moved upwardly and simultaneously. At this time, the θ-Z stage 26 moves beyond the Z-axis position of the probe needle group 1, having been detected previously, by a predetermined distance (hereinafter "the amount of overdrive"). At this time, the needle sensing plate 7 may incline as a result of the press contact with the tip of the probe needle 1b, the inclination being variable in accordance with the position, on the surface of the plate 7, at which the probe needle 1b contacts the plate 7.

In the present embodiment, for detecting such inclination of the needle sensing plate 7, the laser beam 3 is projected upon the bottom surface of the needle sensing plate 7 and the laser beam (3c) reflected back from the needle sensing plate 7 is received by the position sensor 8. Thus, from the position of incidence of the reflected laser beam 3c upon the light-receiving surface of the position sensor 8, the amount of inclination of the needle sensing plate 7, if any, can be detected.

However, consideration should preferably be made of a possibility that a probe needle such as at 1b is deformed when it is press-contacted to the needle sensing plate. If such deformation occurs, the needle sensing plate 7 does not incline in proportion to the amount of pressing motion (i.e. the amount of overdrive) of the plate 7. As a result, the position as detectable by the position sensor 8 (the position of incidence of the laser beam thereupon) does not correspond, in a one-to-one relation, to the position of the probe needle 1b upon the needle sensing plate 7. In order to assure exact correspondence between them in the one-to-one relation, it is necessary to determine the ratio of the spring constant of the probe needle 1b to the spring constant of the spring means comprising springs 60a and 60b.

In consideration of this, according to the present embodiment, the pressing motion of the needle sensing plate 7 may be repeated so that the probe needle 1b is press-contacted, in sequence, to plural locations on the needle sensing plate 7, not a single particular location thereon. From the outputs of the position sensor 8 corresponding to said plural locations on the needle sensing plate 7, the aforesaid ratio of spring constants can be determined. The manner of determination will be described later. Once the ratio of spring constants is determined, the exact position of a probe needle such as a needle 1b can be determined by calculation.

In the FIG. 6 example, the exact position of the tip of the probe needle 1b can be detected by the process described hereinbefore.

Subsequently, by a similar process, the position of the tip of another probe needle (e.g. a probe needle 1c which is at the left up corner of the needle group) is determined. It will be readily understood that any rotational error and any positional error of the probe needle group 1 as a whole are detectable from the detected positions of the tips of the probe needles 1b and 1c.

Once the rotational error is determined, the pulse motor 23 shown in FIG. 2 is used to actually rotate the probe card 20 so as to remove the rotational error. As for the positional error, the movements of the X and Y stages 27 and 28 at the time of actual wafer probing operation are corrected, as required, so as to remove the positional error.

Next, the position measurement teased on the above-described needle searching and the load point detection will be described in more detail, while referring to the manner of calculations involved in these operations.

Needle Searching

In FIG. 5, reference characters A, B, C and D each represents the position of corresponding one of the prism which determine the paths of the laser beams 3a and 3b. Now, it is assumed that each of segments A-C and B-D is inclined by $\pi/4$ in the X and Y coordinate system and that the points A-D are spaced in the X and Y directions by a predetermined distance, e.g., "1" in this example. Then, the coordinates of these points A-D can be expressed as follows:

Point A: $\{(x_p+1)+x_0, (y_p+1)+y_0\}$

Point B: $\{(x_p-1)+x_0, (y_p+1)+y_0\}$

Point C: $\{(x_p-1)+x_0, (y_p-1)+y_0\}$

Point D: $\{(x_p+1)+x_0, (y_p-1)+y_0\}$

It is to be noted here that, as described hereinbefore, the coordinate 0 ($x_0$, $y_0$) corresponds to the center of rotation of the wafer chuck 25 and the coordinate P ($x_p$, $y_p$) corresponds to the point of intersection of the laser beams 3a and 3b.

Next, as described with reference to FIG. 4B, the rotational motion in the θ direction about the point O ($x_0$, $y_0$) and the translational motion in the Y direction are effected while maintaining the laser beam 3b intercepted. If, at this time, the coordinate of a newly established center O' is denoted by ($x_1$, $y_1$) and where the angle defined between segment O-P and segment O'-P' is denoted by $\theta_1$, then the points B and D have the coordinate of points B' and D' shown in FIG. 5 which can be expressed as follows:

Point B': $\{(x_p-1)\cos\theta_1-(y_p+1)\sin\theta_1+x_1,$
$(x_p-1)\sin\theta_1+(y_p+1)\cos\theta_1+y_1\}$ Point D': $\{(x_p+1)\cos\theta_1-(y_p-1)\sin\theta_1+x_1,$
$(x_p+1)\sin\theta_1+(y_p-1)\cos\theta_1+y_1\}$ Here, the position ($x_n$, $y_n$) of a probe needle corresponds to the point P' of intersection between (i) a straight line connecting the points B and D and (ii) a straight line connecting the points B' and D', both on the wafer prober. Thus, the position of the probe needle can be determined as follows:

$$x_n = \frac{\cos\theta_1 + \sin\theta_1 - 1}{2\sin\theta_1} (x_p + y_p) + \quad (1.1)$$

$$\frac{\cos\theta_1 + \sin\theta_1}{2\sin\theta_1} (x_0 + y_0) -$$

$$\left( \frac{\cos\theta_1 - \sin\theta_1}{2\sin\theta_1} x_1 + \frac{\cos\theta_1 + \sin\theta_1}{2\sin\theta_1} y_1 \right)$$

$$y_n = -\frac{\cos\theta_1 - \sin\theta_1 - 1}{2\sin\theta_1} (x_p + y_p) - \quad (1.2)$$

$$\frac{\cos\theta_1 + \sin\theta_1}{2\sin\theta_1} (x_0 + y_0) +$$

$$\left( \frac{\cos\theta_1 - \sin\theta_1}{2\sin\theta_1} x_1 + \frac{\cos\theta_1 + \sin\theta_1}{2\sin\theta_1} y_1 \right)$$

By this, the probe needle position $(x_n, y_n)$ can be determined.

On the other hand, as has been described with reference to FIG. 4E, the crossed laser beams are rotationally shifted in the $\theta$ direction about the point of intersection thereof. If the coordinate of the intersection as the center of such rotational shifting of the laser beams is denoted by $(x_s, y_s)$, then the coordinate can be expressed by the following equations:

$$x_s = (x_0 + x_p) - (x_p \cos\theta_1 - y_p \sin\theta_1) \quad (2.1)$$

$$y_s = (y_0 + y_n) - (x_p \sin\theta_1 - y_p \cos\theta_1) \quad (2.2)$$

Position Measurement Based on Load Point Detection

Referring now to FIG. 7, the principle of load point detection by use of the detecting system shown in FIG. 6 will be described in detail. In FIG. 7, the needle sensing plate 7 which is a two-dimensional planar object is illustrated as a straight line, for convenience of explanation.

The parameters depicted in FIG. 7 are as follows:
D: the amount of overdrive;
$l_1$: the amount of shift of the left-side portion of the plate 7 in the Z direction;
$l_2$: the amount of shift of the right-side portion of the plate 7 in the Z direction;
L: the length (width) or the plate 7;
x: the distance from the center of the plate 7 to the loading point;
$k_0$: the spring constant of the spring members 60a and 60b; and
$k_1$: the spring constant of the probe needle.

Where the inclination of the needle sensing plate 7 is denoted by $d = l_2 - l_1$, the inclination "d" can be determined by the following equation:

$$d = \frac{2\left(\frac{2x}{L}\right)}{\left(1 + 2\frac{k_0}{k_1}\right) + \left(\frac{2x}{L}\right)^2} \cdot D \quad (3.1)$$

It follows therefrom that, if "$k_0/k_1$" is known, the distance "x" from the center of the contact plate to the load point can be determined by detecting the inclination "d" caused in response to the execution of the overdrive of a certain amount D.

It is to be noted here that the amount "d" of the inclination of the needle sensing plate 7 is such magnitude that can be measured easily on the basis of the outputs of the position sensor 8.

Next, the manner of eliminating "$k_0/k_1$" in equation (3.1) will now be described.

First, equation (3.1) can be simplified as follows:

If, $2x/L = X$ and $1 + 2(k_0/k_1) = K$, then, $d = \{2X/(X^2 + K)\}D$

From this, it follows that:

$$D = \{(X^2 + K)/2X\}d \quad (3.2)$$

Considering an occasion in which the needle sensing plate 7 is overdriven by the same amount D with respect to a particularly point and two additional points which are deviated or shifted from the particular point by amounts $\pm a$, respectively, then it follows from equation (3.2) that:

$$d_1 \frac{X^2 + K}{2X} = d_2 \frac{(X + a)^2 + K}{2(X + a)} = d_3 \frac{(X - a)^2 + K}{2(X - a)} \quad (4.1)$$

wherein $d_1$, $d_2$ and $d_3$ are the values concerning the inclination and obtained by the measurements made at the three points.

From equation (4.1), it follows that:

$$d_1 \frac{X^2 + K}{2X} - d_2 \frac{(X + a)^2 + K}{2(X + a)} = 0 \quad (4.2)$$

$$d_1 \frac{X^2 + K}{2X} - d_3 \frac{(X - a)^2 + K}{2(X - a)} = 0 \quad (4.3)$$

By eliminating "K" in the above two equations and, additionally, if it is assumed that:

$d_2/d_1 = M_2$ and $d_3/d_1 = M_3$, then, $$2(2M_2M_3 - M_2 - M_3)X^2 + (M_2 - M_3)aX + (M_2M_3)a^2 = 0 \quad (5.1)$$

In equation (5.1), $M_2$ and $M_3$ are values which can be easily determined by the values $d_1-d_3$. Also, the character $a$ denotes the amount of shift or deviation of the load point, with reference to the load point in the first measurement, in each of the second and third measurements, all the measurements being conducted in sequence under the same amount D of overdrive. The value $a$ is predetermined. Therefore, the value "X" is detectable from equation (5.1) and, accordingly, the coordinate of the load point in the first measurement is detectable therefrom.

It is to be noted here that equation (5.1) is a quadratic equation so that there are two solutions. This is because, even if $M_2$ and $M_3$ are unchanged, one solution can be derived from equation (5.1) wherein $d_1-d_3$ all have signs opposite, respectively, to those of $d_1$–$d_3$ from which the other solution can be derived. In order to extract the real solution, it is well to select one of the two solutions having the same sign as of $d_1$.

It should be noted that the present invention is not limited to the form of the embodiment described hereinbefore. The following modifications may be easily employed, for example.

(1.1) While in the foregoing embodiment, the contact plate 2 made by a single thin glass plate is used to detect the height of the probe needle group 1, the contact plate 2 may be provided by divided plural segments, for lightening in weight. Such an example is illustrated in FIG. 8.

Figure 8:
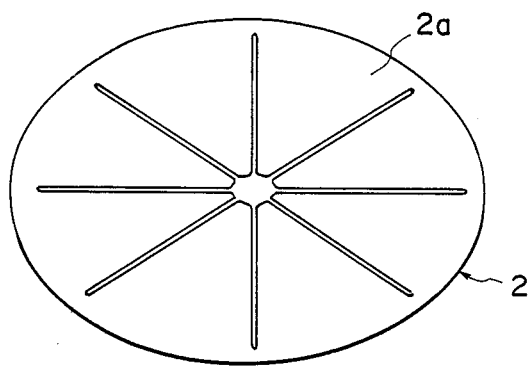
FIG. 8 is a schematic view showing a modified form of contact plate wherein the plate is partially cut.

Denoted at 2a in FIG. 8 are split plates which are cooperable to form a contact plate 2. In this example, eight split-plates are used which plates are joined at the outer peripheral portion of the contact plate 2, as illustrated. This arrangement is effective to decrease the spring constant of the contact plate 2 and also to reduce the weight thereof. As a result, the detecting sensitivity can be improved without lowering the mechanical resonance frequency. Namely, it is possible to provide a detecting system which is not easily affected by external disturbance of low-frequency vibration such as the vibration of the floor, the vibration of a stage and otherwise.

(1.2) As illustrated in FIG. 6, a gaseous fluid such as an air may be discharged toward the lower surface of the contact plate 2. This is effective to prevent the entry of dust or foreign particles. Additionally, it is possible to control the spring constant of the contact plate 2 by controlling the pressure of such a gaseous fluid.

(1.3) The contact plate 2 and the needle sensing plate 7 may be formed as a unit. In such case, the needle sensing plate 7 may be inclined by press-contacting the probe needle group against the contact plate 2. Thus, by detecting the inclination by means of the position sensor 8, the position of the probe needle group can be searched. Such an example is illustrated in FIG. 9.

Figure 9:
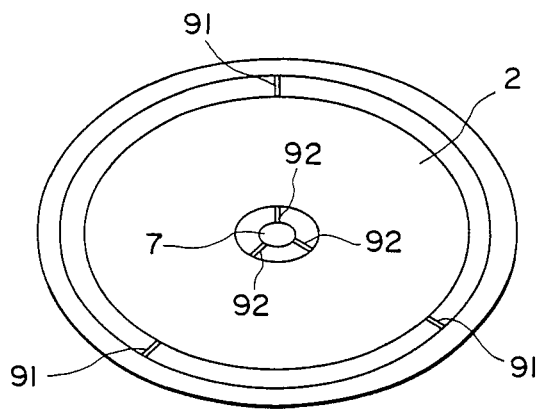
FIG. 9 is a schematic view showing another form of contact plate wherein the plate is formed as a unit with a needle sensing plate.

As shown in FIG. 9, the contact plate 2 and the needle sensing plate 7 are combined by means of three spring members 92. When, in the FIG. 9 example, the needle group 1 is press-contacted to the contact plate 2, the contact plate 2 which is supported by the three spring members 91 may incline in accordance with the same principle as of the case of the needle sensing plate 7. From such inclination, the position of the needle group 1 is detectable On the other hand, when the needle sensing plate 7 is going to be used, the contact plate 2 may be held immovable by, for example, the base member 61 (see FIG. 6) by use of vacuum attraction so that only the spring members 92 are operable. Thereafter, the needle sensing plate 7 is pressed against one selected probe needle.

(2.1) In place of contacting a probe needle to different locations on the needle sensing plate 7, the probe needle may be contacted by plural times to the same location on the needle sensing plate while changing the amount of overdrive. From the values obtained by measuring, by use of the position sensor 8, different amounts of inclinations caused by the overdrives of different amounts, the position of the single load point can be detected. In such case, it is well to solve equation (3.2) with regard to "X" and use an equation similar to equation (4.1) while substituting thereinto each of the different amounts of overdrives.

(2.2) By using the concept of the embodiments described in the foregoing, the position of the needle tip as well as the stylus force load of each of all probe needles or predetermined ones of the probe needles may be examined periodically or at a time when an accidental examination error is caused during the probing operation. If, as a result of such examination, any positional error of the tips of the probe needles or any other error is detected, an alarm may be signaled or displayed.

While the invention has been described with reference to the structures disclosed herein, it is not confined to the details set forth and this application is intended to cover such modifications or changes as may come within the purposes of the improvements or the scope of the following claims.

What is claimed is:

1. A wafer prober, comprising:
   a wafer holder for holding a wafer;
   a stage operable to move said wafer holder substantially in an X-axis direction and a Y-axis direction as well as substantially in a Z-axis direction which is perpendicular to each of the X-axis direction and the Y-axis direction;
   a card holder for holding a probe card having a probe needle which is contactable to a bonding pad of the wafer when it is held by said wafer holder; and
   detecting means operable to detect the position, with respect to the Z-axis direction, of the probe needle of the probe card as it is held by said card holder, said detecting means including a plate-like deformable member movable with said wafer holder, wherein the position of the probe needle is detected on the basic of deformation of said plate-like member by press-contact of the probe needle to said plate-like member.

2. A wafer prober according to claim 1, wherein said plate-like member has a surface to be contacted to the probe needle and wherein said plate-like member is supported so that said surface is placed substantially in parallel to a plane defined by the X and Y axes.

3. A wafer prober according to claim 1, wherein said plate-like member has an electrically conductive thin film formed on the surface thereof which is not contactable to the probe needle and wherein said detecting means includes an electrically conductive base member which is contactable with said thin film of said plate-like member in response to the deformation of said plate-like member.

4. A wafer prober according to claim 3, wherein said plate-like member has a central portion which is divided into plural segments.

5. A wafer prober according to claim 3, wherein said base member is formed with a passageway effective to supply a gaseous fluid between said plate-like member and said base member.

6. A wafer prober, comprising:
   a wafer holder for holding a wafer;
   a stage operable to move said wafer holder substantially along an X axis and a Y axis;
   a card holder for holding a probe card having a probe needle which is contactable to a bonding pad of the wafer as it is held by said wafer holder; and
   detecting means operable to detect the position, with respect to the directions along the X and Y axes, of the probe needle of the probe card as it is held by said card holder, said detecting means including a needle sensing unit which is movable as a unit with said wafer holder, said needle sensing unit having a source of a laser beam, a photodetector and a detecting optical system which is operable to direct the laser beam from said source in a direction substantially parallel to a plane defined by the X and Y axes and to direct the laser beam to said photodetector.

7. A wafer prober according to claim 6, wherein said photodetector is effective to detect the interception of the laser beam by the probe needle.

8. A wafer prober according to claim 7, wherein said detecting means further includes a scale for measuring the position of said needle sensing unit with respect to the directions of the X and Y axes.

9. A wafer prober according to claim 6, wherein said stage is operable to rotationally move said wafer holder in a plane substantially parallel to the plane defined by the X and Y axes, wherein said needle sensing unit is provided eccentrically with respect to the center of rotational motion of said wafer holder and wherein said stage is operable, when said needle sensing unit is rotationally moved about said wafer holder, to move said wafer holder at least in one of the X-axis direction and the Y-axis direction on the basis of an output of said photodetector.

10. A wafer prober according to claim 6, wherein said stage is operable to rotationally move said wafer holder in a plane substantially parallel to the plane defined by the X and Y axes, wherein said needle sensing unit is provided eccentrically with respect to the center of rotational motion of said wafer holder, wherein said stage is operable to rotationally move said needle sensing unit about said wafer holder after said photodetector detects the interception of the laser beam by the probe needle and wherein, at the time of the rotational motion of said needle sensing unit, said stage moves said needle sensing unit at least in one of the X-axis direction and the Y-axis direction so as to maintain the interception of the laser beam by the probe needle.

11. A wafer prober, comprising:
a wafer holder for holding a wafer;
a stage operable to move said wafer holder substantially in each of the directions of X and Y axes and in the direction of a Z axis which is perpendicular to the X and Y axes;
a card holder for holding a probe card having a probe needle which is contactable to a bonding pad of the wafer as it is held by said wafer holder; and
detecting means operable to detect the position, with respect to each of the X-axis direction and the Y-axis direction, of the probe needle of the probe card as it is held by said card holder, said detecting means including a needle sensing member which is resiliently supported by a spring member movable in the Z-axis direction as a unit with said wafer holder and which is contactable to the probe needle of the probe card as it is held by said card holder, wherein the position of the probe needle is detected on the basis of inclination of said needle sensing member by contact to the probe needle.

12. A wafer prober according to claim 11, wherein said detecting means comprises a source of a laser beam and a projection optical system effective to project the laser beam from said source upon a surface of said needle sensing member which surface is not contactable to the probe needle and wherein said detecting means includes a detector having a light-receiving surface adapted to receive the laser bean reflected by said surface of said needle sensing member in a direction corresponding to the inclination of said needle sensing member, said detector producing a signal corresponding to the position of incidence to the laser beam upon said light-receiving surface.

13. A wafer prober according to claim 11, wherein said stage is operable to repeated contact said needle sensing member to the probe needle so that the ratio of a spring constant related to the probe needle and a spring constant related to said spring member resiliently supporting said needle sensing member can be determined.

14. A wafer prober, comprising:
a wafer holder for holding a wafer;
a stage operable to move said wafer holder substantially in the direction of X and Y axes and in the direction of a Z axis which is perpendicular to the X and Y axes;
a card holder for holding a probe card having a probe needle which is contactable to a bonding pad of the wafer as it is held by said wafer holder; and
detecting means operable to detect the position of the probe needle of the probe card as it is held by said card holder, said detecting means including a needle sensing unit movable as a unit with said wafer holder at least in each of the X-axis direction and the Y-axis direction, said needle sensing unit having a source of a laser beam, a photodetector and a detecting optical system effective to direct the laser beam from said source substantially in parallel to a plane defined by the X and Y axes and to direct the laser beam to said photodetector, said detecting means further including a deformable plate movable with said wafer holder in the Z-axis direction, wherein the position of the probe needle in the Z-axis direction is detected on the basis of deformation of said plate by contact of the probe needle to said plate.

15. A wafer prober according to claim 14, wherein said detecting means further includes a spring member movable as a unit with said wafer holder at least in the Z-direction and which is contactable to the probe needle, wherein the position of the probe needle is detected on the basis of inclination of said needle sensing member by contact to the probe needle.

* * * * *

UNITED STATES PATENT AND TRADEMARK OFFICE
CERTIFICATE OF CORRECTION

PATENT NO. : 4,864,227

DATED : September 5, 1989

INVENTOR(S) : Mitsuya Sato

It is certified that error appears in the above-identified patent and that said Letters Patent is hereby corrected as shown below:

Column 10, line 20, "teased" should read --based--;
Column 11, line 13, "(1.2)" should be moved to the end of the line; line 49, "or" should be --of--. Column 12, lines 51-52, "$(M_2M_3)\alpha 2=0$" should read --$(M_2+M_3)\alpha 2=0$--. Claim 1, line 17, "basic" should read --basis--. Claim 12, line 12, "to" should read --of--. Claim 13, line 2, "repeated" should read --repeatedly--. Claim 15, line 2, after "includes" and before "a" please insert --a needle sensing member which is resiliently supported by--.

Signed and Sealed this

Twenty-fourth Day of December, 1991

Attest:

HARRY F. MANBECK, JR.

*Attesting Officer*  *Commissioner of Patents and Trademarks*